(12) United States Patent
Shiraishi (10) Patent No.: US 6,627,365 B1
(45) Date of Patent: Sep. 30, 2003

(54) PHOTOMASK AND PROJECTION EXPOSURE APPARATUS

(75) Inventor: Naomasa Shiraishi, Tokyo (JP)

(73) Assignee: Nikon Corporation, Tokyo (JP)

( * ) Notice: Subject to any disclaimer, the term of this patent is extended or adjusted under 35 U.S.C. 154(b) by 32 days.

(21) Appl. No.: 09/664,056

(22) Filed: Sep. 18, 2000

Related U.S. Application Data (63) Continuation of application No. PCT/JP99/01261, filed on Mar. 16, 1999.

(30) Foreign Application Priority Data

Mar. 20, 1998 (JP) ............................................. 10-072074

(51) Int. Cl.⁷ .............................. G03C 5/00; G03F 9/00
(52) U.S. Cl. ............................. 430/30; 430/5; 430/396; 430/311
(58) Field of Search .................................. 430/311, 312, 430/323, 324, 325, 22, 30, 296, 5, 313, 315, 316, 396; 428/14

(56) References Cited

U.S. PATENT DOCUMENTS

| 5,835,284 A | 11/1998 | Takahashi et al. |
| 5,883,704 A | 3/1999 | Nishi et al. |
| 5,938,860 A * | 8/1999 | Williams .................... 134/34 |

FOREIGN PATENT DOCUMENTS

| EP | 1 031 877 A1 | 11/1998 |
| EP | 1 059 550 A1 | 12/2000 |
| JP | 7-12019 | 2/1995 |
| JP | 8-160597 | 6/1996 |
| JP | 8-321459 | 12/1996 |
| JP | 9-73167 | 3/1997 |
| JP | 9-197652 | 7/1997 |
| JP | 63-6553 | 1/1998 |
| JP | 10-20197 | 1/1998 |
| JP | 10-20480 | 1/1998 |
| JP | WO99/24869 | 5/1999 |
| WO | WO 00/39623 | 7/2000 |

* cited by examiner

Primary Examiner—Mark F. Huff
Assistant Examiner—Saleha R. Mohamedulla
(74) Attorney, Agent, or Firm—Oliff & Berridge, PLC

(57) ABSTRACT

A photomask, on which a transfer pattern is formed, for being irradiated with a predetermined exposure beam, and methods for making and using the photomask and an apparatus for practicing the methods, the mask having a pattern surface on which the pattern is formed and a substrate being transparent with respect to the exposure beam, having a predetermined thickness, and being disposed such that the substrate is separated from the pattern surface at a predetermined distance via a supporting member.

11 Claims, 5 Drawing Sheets

PHOTOMASK AND PROJECTION EXPOSURE APPARATUS

This is a continuation of Application No. PCT/JP99/01261 filed Mar. 16, 1999. The entire disclosure of the prior application is hereby incorporated by reference.

Field of the Invention

The present invention relates to a photomask and a projection exposure apparatus, and more particularly, to a photomask formed with an original pattern to be transferred on a substrate in a lithography process for producing devices such as semiconductor integrated circuits, image pickup devices (CCDs etc.), liquid crystal displays and thin-film magnetic heads, etc. and to a projection exposure apparatus for transferring a predetermined pattern onto a substrate to be exposed using the photomask.

Description of the Related Art

When devices such as the semiconductor integrated circuits are manufactured, a transfer method is used in which, using a photomask on which an original pattern obtained by scaling up a circuit pattern to be formed four to five times is formed, the pattern of this photomask is reduced and projected on the substrate to be exposed such as a wafer, a glass plate or the like through a reduction projecting optical system. An apparatus used when such a photomask pattern is transferred is the projection exposure apparatus. A photomask used in a step-and-repeat type reduction projection apparatus is also called as a reticle.

When such a photomask pattern is transferred, if foreign particles such as particles having a size exceeding tolerance are attached on a pattern surface, an image of the foreign particles is also transferred onto the substrate such as a wafer etc., and there is a fear that a finally produced integrated circuit and the like may malfunction. Thereupon, conventionally, an exposure light-transparent thin film called pellicle made of organic material having a thickness of about 1 to 10 μm was provided, in a stretched manner, at a position away from the photomask pattern surface by 5 mm so that the pellicle prevented the foreign particles from attaching on the pattern surface. The pellicle was stretched over a metal supporting frame called a pellicle frame, a space between the pattern surface of the photomask and the pellicle was substantially cut off from outside air so that foreign particles included in the outside air would not attach to the pattern surface.

As described above, the pellicle made of a thin film of organic material was stretched over the conventional photomask pattern surface for dustproof. Further, in the conventional technique, i-line (wavelength of 365 nm) of a mercury lamp was mainly used as the exposure light of the projection exposure apparatus using the photomask. The conventional pellicle had sufficient endurance with respect to the exposure light of such a wavelength.

Recently, the wavelength of exposure light of the projection exposure apparatus tends to be shorter in order to cope with finer semiconductor integrated circuits, and a KrF excimer laser (wavelength of 248 nm) is becoming mainstream recently. Presently, an ArF excimer laser of shorter wavelength (wavelength of 193 nm) is becoming practical, and a research on the development of a projection exposure apparatus using $F_2$ laser light of shorter wavelength (wavelength of 157 nm) is also conducted.

With such a shorter wavelength trend of exposure light, it has been difficult for the conventional organic pellicle to obtain sufficient endurance. That is, since exposure light of shorter wavelength has higher energy per one photon, chemical bonds of organic molecules constituting the pellicle are destroyed by the exposure light. For this reason, it is becoming difficult to provide a pellicle made of organic material having sufficient endurance against the exposure light of short wavelength.

However, if the pellicle is not used, foreign particles can not be prevented from attaching to the pattern surface of the photomask, and there is an inconvenience that yield of produced semiconductor integrated circuits etc. is lowered.

SUMMARY OF THE INVENTION

In view of the above circumstances, it is a first object of the present invention to provide a photomask having sufficient endurance against exposure beam of short wavelength and capable of preventing foreign particles from attaching to a pattern to be transferred.

Further, a second object of the present invention is to provide a projection exposure apparatus suitable for performing exposure using such a photomask.

Still further, a third object of the present invention is to provide an exposure method capable of preventing foreign particles from attaching to a pattern of a photomask and capable of transferring a finer pattern with high precision even if exposure beam of short wavelength is used, and to provide a method for producing a high-performance device using such an exposure method.

According to a first aspect of the present invention, there is provided a photomask, on which a transfer pattern is formed, for being irradiated with a predetermined exposure beam, comprising a pattern surface on which the pattern is formed, and a substrate being transparent with respect to the exposure beam, having a predetermined thickness, and being disposed such that the substrate is separated from the pattern surface at a predetermined distance via a supporting member.

According to the above-mentioned photomask, the substrate which is transparent with respect to the exposure beam, i.e., the substrate made of material including no organic material is used instead of the thin film (pellicle) made of organic material having a thickness of about 1 to 10 μm which was conventionally used for preventing foreign particles from attaching. With this structure, it is possible to prevent the foreign particles from attaching, and to obtain the sufficient endurance against the exposure beam of short wavelength.

In the present invention, when the exposure beam is of ultraviolet light having a wavelength of about 100 nm to about 300 nm, it is preferable to seal a space surrounded by the substrate, the supporting member and the pattern surface, and to fill the sealed space with a nitrogen gas, a helium gas or a hydrogen gas.

In this case, since, for example, ArF excimer laser light is greatly absorbed by oxygen, if the sealed space is filled with a gas that does not absorb ultraviolet rays so much such as a nitrogen gas, a helium gas and a hydrogen gas, an attenuation of exposure beam is decreased, and the exposure beam can be utilized more efficiently. Further, helium gas is safe and hydrogen gas is inexpensive.

Further, the distance between the substrate and the pattern surface is preferably about 2 mm to about 10 mm, and the thickness of the substrate is preferably about 0.05 mm to about 2 mm. If the distance is narrower than 2 mm, an image of foreign particles attached to a surface of the dustproof substrate may adversely be transferred on the substrate to be exposed relatively clearly. On the other hand, if the distance exceeds 10 mm, when the photomask is placed in the projection exposure apparatus, the transparent substrate may adversely interfere with a stage and the like mechanically, and this is not preferable. If the thickness of the transparent substrate is thinner than 0.05 mm, the substrate may be damaged by a thermal deformation of a substrate of the photomask itself, and if the thickness exceeds 2 mm, a correction amount of image-forming characteristics of a projector optical system using the photomask may be excessively increased, and this is not preferable.

When a wavelength of the exposure beam is about 100nm to about 180 nm, the substrate is preferably made of any one of silica glass ($SiO_2$), fluorite ($CaF_2$), magnesium fluoride ($MgF_2$), quartz, lithium fluoride (LiF), lanthanum fluoride ($LaF_3$), and lithium-calcium-aluminum-fluoride (commonly called "LiCAF crystal").

Organic material is easily damaged by ultraviolet light having wavelength of about 100 nm to about 300 nm, but the above-mentioned silica glass and fluorite, etc. can be used also as lens material for a projection optical system using the ArF excimer laser light (wavelength of 193 nm), and have sufficient endurance against exposure beam radiation of such short wavelength. As the silica glass, it is possible to use not only a normal synthetic quartz but also a synthetic quartz having fluorine.

It is preferable that the photomask includes a protecting member (for example, such as a metal film) for covering adhesive or filler for sealing between the substrate and the supporting member or between the pattern surface and the supporting member. When the photomask includes the protecting member, it is possible to prevent impurities (for example, such as silicon-based organic substance) from being generated from the adhesive or filler, and to prevent transmissivity of the substrate and the photomask substrate from being deteriorated, which is caused when the impurities attach to the substrate and the photomask substrate or enter (float into) an illumination light path.

Next, according to a second aspect of the present invention, there is provided an exposure method, comprising a step of transferring, with a predetermined exposure beam, a pattern of a mask onto a substrate to be exposed, wherein the mask includes a pattern surface and a substrate, the pattern being formed on the pattern surface, the substrate being transparent with respect to the exposure beam and being disposed such that the substrate is separated, at a predetermined distance, from the pattern surface, and a space between the substrate and the pattern surface being substantially sealed.

According to the above exposure method, even if an exposure beam of short wavelength is used, it is possible to prevent foreign particles from attaching to the pattern surface of the mask and to transfer a finer pattern with high precision.

When the exposure beam is of ultraviolet light having a wavelength of about 100 to about 300 nm, it is preferable to fill the sealed space with a nitrogen gas, a helium gas or a hydrogen gas. The distance between the substrate and the pattern surface is preferably about 2 mm to about 10 mm, and the thickness of the substrate is preferably about 0.05 mm to about 2 mm.

According to a third aspect of the present invention, there is provided a method for manufacturing a device, comprising the exposure step of transferring, using the above-mentioned exposure method according to the present invention, an image of the pattern of the mask onto the substrate to be exposed.

With the method, it is possible to transfer a finer pattern with high precision and to produce a high-performance device.

A thickness of the transparent substrate of the photomask of according to the present invention is extremely thick as compared with the thickness (1 to 10 $\mu$m) of the conventionally used pellicle made of an organic thin film, and an aberration, especially a spherical aberration generated when an image-forming luminous flux passes through the substrate becomes great enough not to be ignored.

Thereupon, in the projection exposure apparatus according to the present invention using the photomask having the dustproof transparent substrate, it is preferable to design and produce the projection optical system taking the aberration generated by the transparent substrate into consideration from the design phase of the projection optical system.

That is, according to a fourth aspect of the present invention, there is provided a projection exposure apparatus for handling the above-mentioned photomask, comprising an illumination optical system for illuminating the photomask with the exposure beam, and a projection optical system for projecting an image of the pattern of the photomask onto the substrate to be exposed with the exposure beam passing through the pattern surface of the photomask and the transparent substrate, wherein an image-forming state of the projection optical system is adjusted in accordance with at least one of the thickness of the transparent substrate of the photomask and the distance between the substrate and the pattern surface.

With this feature, even the image of the pattern on the photomask having such a thick transparent substrate can precisely be transferred to the substrate to be exposed.

Further, the above-mentioned projection exposure apparatus according to the present invention is produced by mechanically and optically assembling the above-described various members so that an aberration caused by the substrate can be compensated.

In this case, it is preferable to provide an image-forming state adjusting mechanism for adjusting the image-forming state of the projection optical system in accordance with at least one of the thickness of the transparent substrate of the photomask and the distance between the substrate and the pattern surface. At that time, even if the thickness of the transparent substrate is varied among the transparent substrates due to such as errors caused during production, by adjusting the image-forming state of the projection optical system in accordance with the thickness of each of the dustproof transparent substrates of the photomasks to be exposed, it is possible to precisely transfer each of the patterns of corresponding photomasks.

It is preferable to design and produce the projection optical system in accordance with at least one of the thickness of the substrate and the distance between the substrate and the pattern surface, and an aberration of the projection optical system caused by the substrate is corrected.

According to a fifth aspect of the present invention, there is provided an exposure apparatus for transferring, with an exposure beam, an image of a pattern formed- on a mask onto a substrate to be exposed, comprising an adjusting mechanism, wherein the mask includes a substrate for protecting a pattern surface on which the pattern is formed, the substrate being transparent with respect to the exposure beam and having a predetermined thickness, and the adjusting mechanism adjusts an image-forming state of the image of the pattern with consideration given to the predetermined thickness of the substrate.

According to a sixth aspect of the present invention, there is provided an exposure method, comprising a step of transferring, with an exposure beam, an image of a pattern formed on a mask onto a photosensitive substrate, wherein the mask includes a substrate, the substrate being disposed such that the substrate is separated, at a predetermined distance via a supporting member, from a: pattern surface on which the pattern is formed, being transparent with respect to the exposure beam and having a predetermined thickness, and an image-forming state of the image of the pattern is adjusted with consideration given to at least one of the predetermined thickness of the substrate and the distance between the substrate and the pattern surface.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

One example of a preferred embodiment of a photomask according to the present invention will be explained below with reference to FIGS. 1A and 1B. In this example, the present invention is applied to a reticle used as a transfer original pattern in a projection exposure apparatus using exposure light of a short wavelength such an ArF excimer laser light(wavelength of 193 nm) or $F_2$ laser light (wavelength of 157 nm).

Figure 1A:
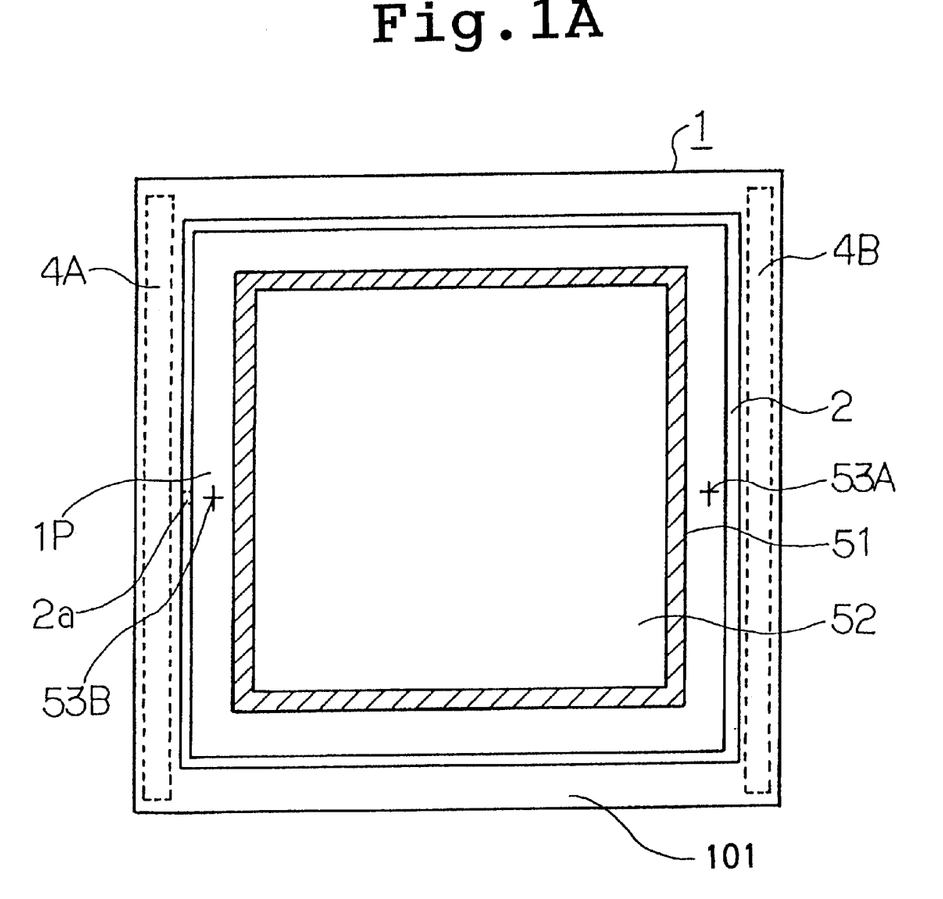
FIG. 1A is a bottom view of a reticle as one example of an embodiment of a photomask according to the present invention.
Figure 1B:
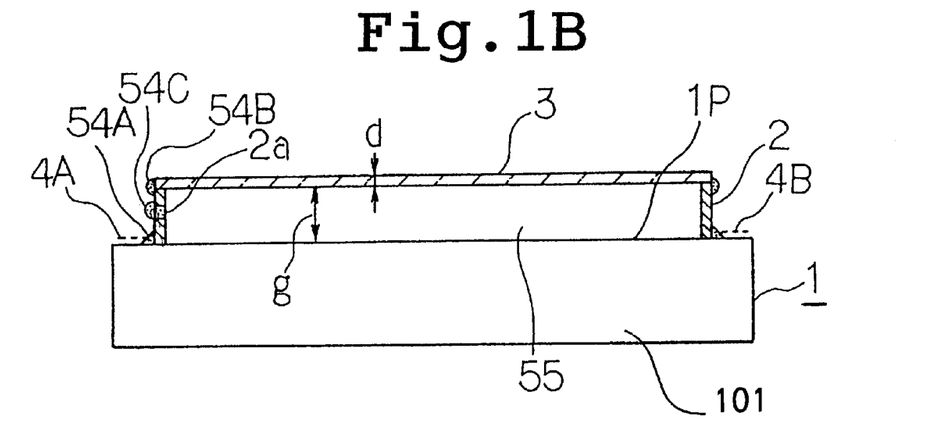
FIG. 1B is a partially sectional side view of FIG. 1A.

FIG. 1A is a bottom view of the reticle 1 of the present embodiment as viewed from a pattern surface, and FIG. 1B is a side view of the reticle 1. In FIGS. 1A and 1B, the reticle 1 is formed by forming a rectangular light-shielding band 51 on a bottom surface ("pattern surface 1P", hereinafter) of a substrate 101 which is transparent with respect to ultraviolet rays and which is made of silica glass, and fluorite or the like, and by writing an original pattern in a pattern region 52 inside the light-shielding band 51. A pair of alignment marks 53A and 53B are formed on the pattern surface 1P such as to sandwich the light-shielding band 51.

A rectangular frame-like holding frame 2 having a thickness "g" is secured on the pattern surface 1P by an adhesive such as to surround the light-shielding band 51 and the alignment marks 53A and 53B. A substrate 3 transparent with respect to ultraviolet rays and having a thickness "d" is secured on the holding frame 2 by an adhesive. That is, the transparent substrate 3 is disposed over the pattern surface 1P of the reticle 1 at a distance "g". Two narrow and long regions on the pattern surface 1P at outer sides of the holding frame 2 are absorbing regions 4A, 4B. When the reticle 1 is transferred to and from a projection exposure apparatus, the absorbing regions 4A, 4B of the reticle 1 are secured, by vacuum suction, to a reticle loader system and a reticle stage of the projection exposure apparatus.

In the present example, a sealant 54A as a filler seals between the holding frame 2 and the pattern surface IP, and a sealant 54B seals between the holding frame 2 and the substrate 3, and a space 55 surrounded by the pattern surface 1P, the holding frame 2 and the substrate 3 is hermetically closed (sealed). Therefore, since the space 55 is isolated from outside air, foreign particles such as dust included in the outside air are prevented from attaching to the pattern region 52 on the pattern surface 1P during such as transfer of the reticle 1 etc.

Examples of a material of the transparent substrate 3 that can be used are silica glass ($SiO_2$), fluorite ($CaF_2$) and magnesium fluoride ($MgF_2$). As the silica glass, it is possible to use such as synthetic quartz, or synthetic quartz having fluorine (F) for reinforcing the endurance against a short wavelength light, etc. These materials have not only high transmittancy of ultraviolet rays, but also sufficient endurance against the ultraviolet rays. Opposite surfaces of a flat plate made of such material are polished and worked such that its thickness becomes equal to "d", thereby forming the substrate 3.

Other examples of the substrate 3 that can be used are quartz, lithium fluoride (LiF), lanthanum fluoride ($LaF_3$), and lithium-calcium-aluminum-floride (LiCAF crystal), etc. The reticle 1 of the present example is preferably used in a projection exposure apparatus using exposure light of vacuum ultraviolet region (wavelength is about 200 nm or shorter), more preferably of wavelength of about 100 nm to about 180 nm. The substrate 101 of the reticle 1 may be made of material that can be used for the substrate 3, and may be made of the same material as that of the substrate 3.

It is desirable that the thickness "d" of the substrate 3 is in a range of about 0.05 mm to about 2 mm. If the thickness "d" is excessively thinner, the endurance against a thermal expansion of the substrate 101 of the reticle 1 and against a deformation stress due to a thermal expansion of gas within the sealed space 55 becomes insufficient, and if the thickness "d" is excessively thicker, an aberration (which will be described later) generated due to the excessive thickness becomes excessively great, which is not preferable. However, if a correction amount of aberration can be increased in the projection optical system, the thickness "d" of the substrate 3 may be set 2 mm or thicker. Since there is a variation in the thickness "d" of the substrate 3 due to errors caused during production, data of an actually measured thickness "d" of the substrate 3 is added to exposure data of the reticle 1.

Further, the distance "g" between the pattern surface 1P and the transparent substrate 3 is preferably about 2 mm to about 10 mm. If the distance "g" is narrower than 2 mm, an image of foreign particles attached on the substrate 3 is projected on the substrate to be exposed relatively clearly even if the image of the foreign particles is defocused. On the other hand, if the distance "g" exceeds 10 mm, there is a fear that the substrate 3 mechanically interferes with the reticle stage when the reticle 1 is placed on the reticle stage of the projection exposure apparatus. On the contrary, when the thickness "g" is large, and if the reticle stage is formed such that it will not interfere with the substrate 3, there is a fear that the rigidity and the like of the reticle stage are lowered. Further, it is necessary that a working distance of on the reticle side of the projection optical system used for image transferring of the reticle 1 is equal to or greater than the distance "g". Therefore, if the distance "g" becomes greater, there is a fear that a degree of freedom in design of the projection optical system is lowered.

Like the conventional reticle, the reticle 1 of the present example is used for transferring the original pattern 52 written on the pattern surface 1P using the projection exposure apparatus. When the wavelength of exposure light of the projection exposure apparatus is 193 nm of the ArF excimer laser, it is preferable that the space 55 surrounded by the pattern surface 1P, the holding frame 2 and the substrate 3 shown in FIG. 1B is filled with nitrogen gas ($N_2$), helium gas (He) or hydrogen gas ($H_2$). If oxygen is mixed in the space 55, since the oxygen absorbs a large amount of ultraviolet rays having a wavelength of about 200 nm or shorter, the transmissivity of exposure light is enhanced by replacing air in the space 55 by gas that does not absorb such ultraviolet rays so much.

When the wavelength of exposure light of the projection exposure apparatus is 157 nm of the $F_2$ laser also, gas filled in the space 55 is preferably nitrogen gas, helium gas or hydrogen gas. In such a short wavelength region, since an amount of ultraviolet rays absorbed by oxygen gas is extremely large, it is necessary to enhance the purity of the gas to be filled, and to lower the density of impurities such as oxygen as small as possible.

If the exposure light wavelength becomes 150 nm or shorter, nitrogen gas also absorbs ultraviolet rays and thus, it is preferable to fill the space 55 with helium gas or hydrogen gas.

In order to seal gas whose absorption amount of ultraviolet rays is small in the space 55, for example, a side face of the holding frame 2 is provided with a gas supplying hole 2a and a gas discharging hole (not shown), gas whose absorption amount of ultraviolet rays is small is filled in the space 55 through the hole 2a and the like and then, the hole 2a and the like are sealed with a sealant 54C. Alternatively, the substrate 3 may be adhered on the holding frame 2 in an atmosphere of the gas whose absorption amount of ultraviolet rays is small.

Although the space 55 surrounded by the pattern surface 1P, the holding frame 2 and the substrate 3 is isolated from outside air in the above embodiment, when gas whose absorption amount of ultraviolet rays is small is supplied also to a periphery of the reticle 1 for example, a small vent hole (not shown) may be formed in the side face of the holding frame 2 to bring the space 55 and the outside into slight communication with each other. At this time, it is preferable to provide a sub-chamber for accommodating the reticle stage therein, in addition to a chamber for accommodating the entire apparatus including the projection optical system and the like, thereby supplying gas whose absorption amount of ultraviolet rays is small into the sub-chamber. Further, a tube is provided connectably to a vent hole (not shown) formed in the side face of the holding frame 2 in the projection exposure apparatus, and the gas whose absorption amount of ultraviolet rays is small may be positively supplied into the space 55 through the tube. When air is filled into the space 55 also, it is possible to employ a structure in which a vent hole (not shown) is formed in the side face of the holding frame 2 to bring the space 55 and the outside into communication with each other.

Further, since adhesives (fillers) fix (seal) between the holding frame 2 and the reticle 1 and between the holding frame 2 and the substrate 3, it is possible to conceive that impurities (for example, silicon-based organic substance, etc.) which lowers the transmissivity of the reticle 1 and the substrate 3 may be generated from the adhesive. Thereupon, in order to prevent impurities from being generated at least in the space 55, it is desirable to coat the adhesive with a metal film, a cover or the like.

Next, embodiments of the projection exposure apparatus that can be used for transferring the original pattern of the reticle 1 shown in FIG. 1 onto the substrate to be exposed such as a wafer will be explained with reference to FIGS. 2 to 5.

Figure 2:
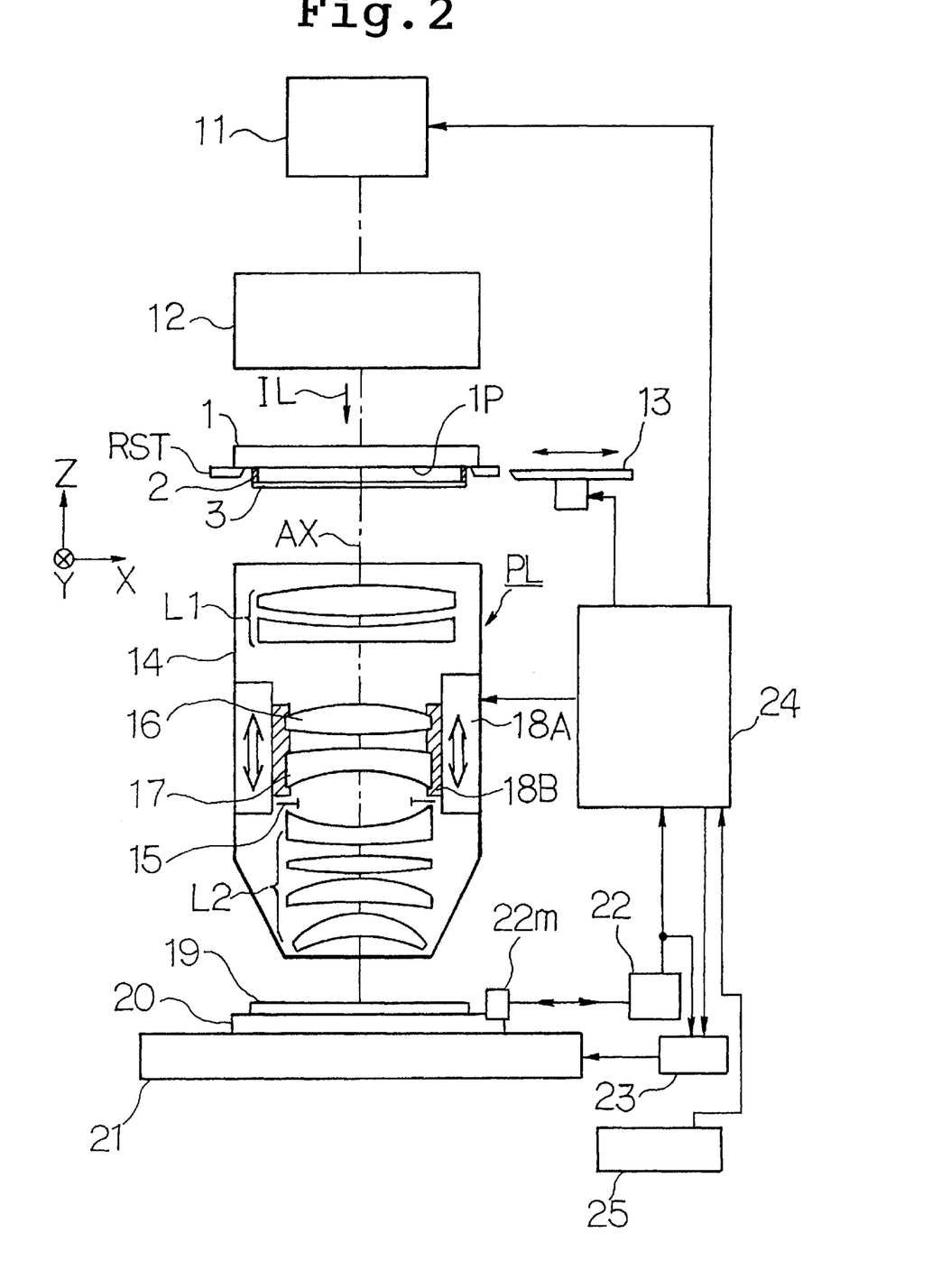
FIG. 2 is a partially broken view of a structure of a first embodiment of a projection exposure apparatus for performing exposure using the reticle shown in FIG. 1.

FIG. 2 shows a first embodiment of such a projection exposure apparatus. In FIG. 2, the absorbing regions 4A, 4B of the reticle 1 of FIG. 1 are held on a reticle stage RST by vacuum suction, and the substrate 3 which is transparent with respect to the exposure beam is disposed under the pattern surface (lower surface) 1P of the reticle 1 at a predetermined distance via the holding frame 2.

At the time of exposure of light, exposure light IL of ultraviolet pulse light having a wavelength of 193 nm emitted from an exposure light source 11 of, for example, an ArF excimer later light source passes through an illumination system 12 including an optical integrator (homogenizer), an aperture stop, a field stop (reticle blind), a condenser lens system, etc., and illuminates a pattern region on the pattern surface 1P of the reticle 1 with uniform illumination distribution. Under the exposure light IL, the image of the pattern in the illumination region of the pattern surface of the reticle 1 is projected on a shot region of exposure target of a wafer 19 on which photoresist is coated, under projection magnification β (β is, for example, one fourth, one fifth or the like) through a both side telecentric (or one side telecentric at the wafer side) projection optical system PL. The projection optical system PL has a lens barrel 14 in which a lens system L1, lenses 16, 17, an aperture stop 15 and a lens system L2 are arranged in this order from the reticle side toward the wafer side. The structure shown in FIG. 2 will be explained below based on the following three axes, i.e., Z-axis is taken to be parallel with an optical axis AX of the projection optical system PL, X-axis is taken to be in a plane perpendicular to the Z-axis and parallel with the paper surface of FIG. 2 and Y-axis is taken to be perpendicular to the paper surface of FIG. 2.

First, the reticle 1 is absorbed and held on the reticle stage RST which performs positioning of the reticle 1 within the X-Y plane, and the position of the reticle stage RST is measured by a laser interferometer (not shown). The wafer 19 is held by vacuum suction on a wafer holder (not shown), the wafer holder is fixed on a sample stage 20, and the sample stage 20 is placed on an X-Y stage 21 such that the sample stage 20 can move in an X-direction and in a Y-direction. The position of the sample stage 20 in the X-Y plane is measured by a moving mirror 22m on the sample stage 20 and a laser interferometer 22, and the measured value is supplied to a main control system 24 and a wafer stage driving system 23. The wafer stage driving system 23 performs positioning of the sample stage 20 by driving the X-Y stage 21 based on the supplied measured value and control information from the main control system 24. In a bottom of the sample stage 20 is incorporated a focusing mechanism for aligning a surface of the wafer 19 with an image surface of the projection optical system PL in an automatic focusing manner based on the measured value by an automatic focusing sensor (not shown).

Further, a reticle loader 13 is disposed in the vicinity of a side face of the reticle stage RST. The main control system 24 controls the operation of the reticle loader 13 and exchanges the reticle on the reticle stage RST. Connected to the main control system 24 is a storage device 25 such as a magnetic disc device in which exposure data including information on a thickness of a dustproof transparent substrate (the substrate 3 in FIG. 2) of a reticle 1 of exposure target and a distance between the substrate and a pattern surface of the reticle is stored.

Since the projection exposure apparatus of the present embodiment is of a stepper type (full field exposure type, or static exposure type), when the exposure to one shot region on the wafer 19 is completed, the next shot region on the wafer 19 moves to an exposure region by the projection optical system PL by the stepwise movement of the sample stage 20 through the X-Y stage 21, and the operation for exposing a pattern image of the reticle 1 is repeated.

When the dustproof transparent substrate 3, like the reticle 1 of the present embodiment, thicker than a conventional pellicle is disposed in an image-forming luminous flux, i.e., between the wafer 19 and the pattern surface 1P of the reticle 1, an aberration is adversely generated in a projected image even though a flatness of the substrate 3 is ideal. When the projection optical system PL is a presently general so-called double side telecentric image-forming optical system, only a spherical aberration is generated by the thick substrate 3, but when the projection optical system PL is not telecentric on the reticle side, astigmatic aberration and coma aberration are also adversely generated in the peripheral positions of the image.

Thereupon, in the projection exposure apparatus of the present embodiment, an operation for correcting aberration is previously carried out, including the thick transparent substrate 3, from the design phase of the projection optical system PL. With this operation, even when the substrate 3 is included in the image-forming light path like the reticle 1 of the present embodiment, it is possible to form a precise pattern image on the wafer 19. In the present embodiment, the aberration is corrected based on reference values concerning the thickness and the flatness of the substrate 3.

In this regard, there is a fear that the thickness of the transparent substrate 3 used for the reticle 1 of the present embodiment is slightly varied due to production errors caused during production (i.e., the thickness may be different from the above-described reference value). This variation in thickness adversely varies an amount of an aberration generated by the substrate 3. In order to cope with the variation in the aberration amount, the lenses 16 and 17 as parts of optical members of the projection optical system PL of the present embodiment are constructed such that they can finely move in a direction of a light axis AX. That is, the lenses 16 and 17 are secured within a lens frame 18B, the lens frame 18B is accommodated in a vertically moving mechanism 18A, and the vertically moving mechanism 18A is secured in the lens barrel 14. The vertically moving mechanism 18A and the lens frame 18B constitute an image-forming state adjusting mechanism. According to the control information from the main control system 24, the vertically moving mechanism 18A finely moves the lens frame 18B in the light axis AX (Z-direction) by means of a feed screw method for example.

Whenever the reticle on the reticle stage RST is exchanged through the reticle loader 13, the main control system 24 reads out, from an exposure data file in the storage device 25, the thickness of the dustproof transparent substrate (substrates 3 in FIG. 2) disposed over the pattern surface of the reticle that is to be exposed from now, obtains an driving amount of the lens frame 18B (lenses 16, 17) for compensating the variation amount of aberration of the projection optical system PL caused by the thickness of the substrate, and sends the driving amount information to the vertically moving mechanism 18A. With this operation, the positions of the lenses 16, 17 in the Z-direction are adjusted, and an ideal image-forming characteristics are maintained.

At this time, an optical state to be adjusted is mainly the spherical aberration. When the spherical aberration is adjusted, it is preferable to adjust a position of an optical member in the vicinity of the aperture stop 15 located in a pupil plane of the projection optical system PL. Thereupon, in the present embodiment, the lenses 16 and 17 in the vicinity of the aperture stop 15 are constructed to be able to finely move. Since the image-forming characteristics of the projection optical system PL are corrected in accordance with the thickness of the dustproof substrate in the present embodiment in this manner, even if there is a variation in thickness of the substrate, an image of a pattern of the reticle can be transferred on the wafer with high precision.

When it is necessary to further correct astigmatic aberration and coma aberration, etc., driving mechanisms for corresponding optical members may be provided. When there is also a variation in distance between the pattern surface of the reticle 1 and the substrate 3, the correction amount of the image-forming characteristics may be determined while taking the distance into consideration.

Figure 3:
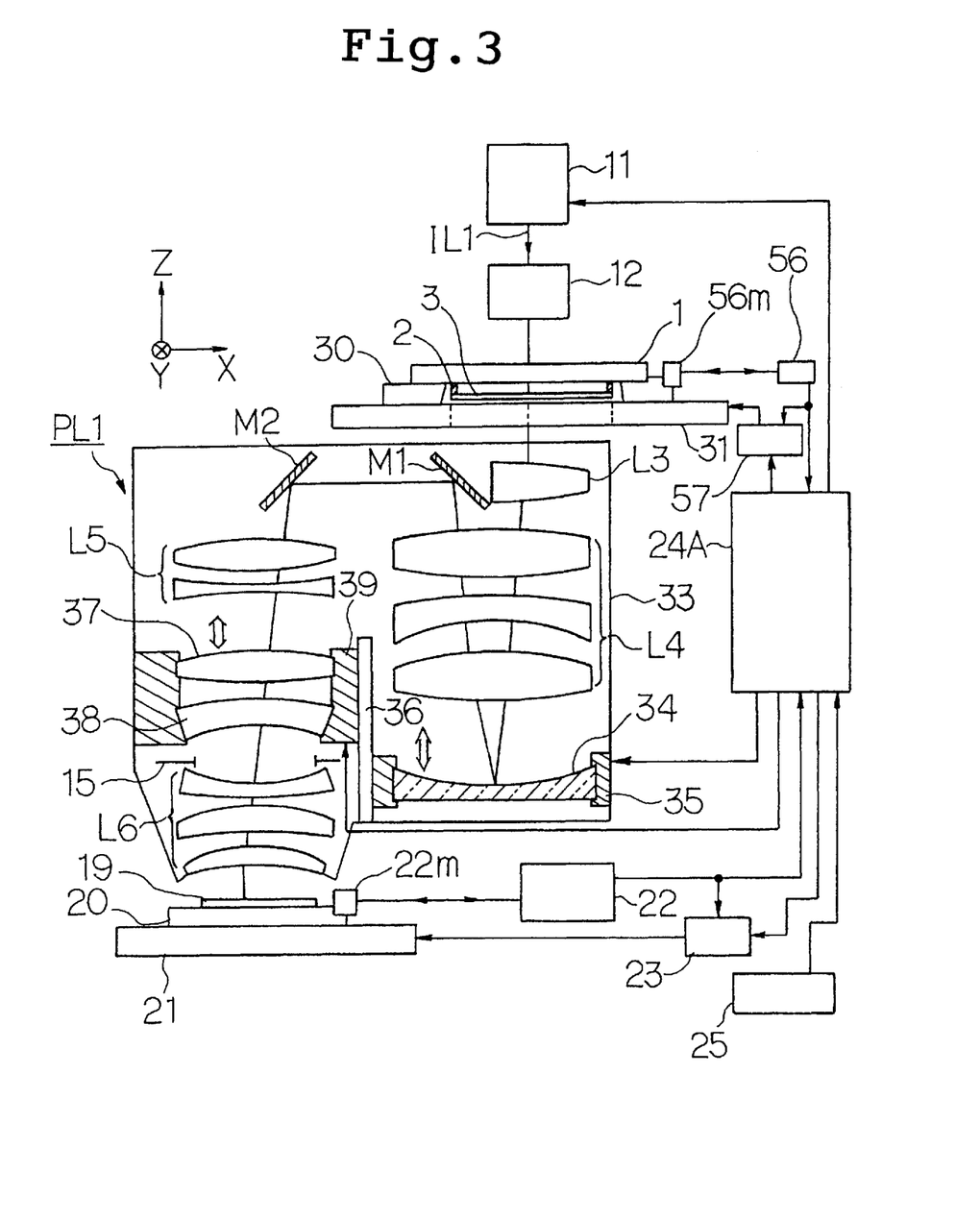
FIG. 3 is a partially broken view of a structure of a second embodiment of the projection exposure apparatus for performing exposure using the reticle shown in FIG. 1.

Next, a second embodiment of the projection exposure apparatus using the reticle shown in FIG. 1 will be explained with reference to FIG. 3. This is an embodiment of a projection exposure apparatus in which a catadioptric system (catadioptric image-forming system) is used as the projection optical system, and exposure is carried out in a step and scan method. In FIG. 3, elements corresponding to those shown in FIG. 2 are represented with the same reference symbols, and a detailed explanation thereof will be omitted.

FIG. 3 shows the projection exposure apparatus of this embodiment. In FIG. 3, the reticle 1 is absorbed and held on a reticle stage 30, and the dustproof transparent substrate 3 is disposed over the pattern surface of the reticle 1 via the holding frame 2. At the time of exposure, exposure light IL1 having, for example, a wavelength of 193 nm from the exposure light source 11 and the illumination system 12 illuminates a narrow and long rectangular-shaped or arc-shaped illumination region on a pattern region of the reticle 1, and an image of the pattern in the illumination region is projected by the wafer 19 through a projection optical system PL1 with a predetermined projection magnification. The projection optical system PL1 is a catadioptric system, and an image-forming luminous flux that passed through the reticle 1 and the transparent substrate 3, passes through a semi-circular lens L3 and an axisymmetric lens system L4, and is reflected by a concave mirror 34 in a lens barrel 33 of the projection optical system PL1. Then, the light path is again bent downward through the mirror system L4, a mirror M1 and a mirror M2, and introduced onto the wafer 19 through a lens system L5, a lens 37, a lens 38, an aperture stop 15 and a lens system L6. The structure shown in FIG. 3 will be explained below based on the following three axes, i.e., Z-axis is taken to be parallel with an optical axis of the projection optical system PL1 on the wafer side, Xaxis is taken to be in a plane perpendicular to the Z-axis and parallel with the paper surface of FIG. 3, and Y-axis is taken to be perpendicular to the paper surface of FIG. 3. In this case, the reticle I is illuminated by the illuminated region that is elongated in the Y-direction, and a scanning direction when the reticle 1 and the wafer 19 are scanned and exposed is X-direction.

The reticle stage 30 can move at a constant speed in the X-direction on a reticle base 31 by a linear motor method for example, and can finely move in the X-direction, the Y-direction and a rotation direction. The position and the angle of the reticle stage 30 are measured by a moving mirror 56m and a laser interferometer 56, and the measured value is supplied to a reticle stage driving system 57 and a main control system 24A. The reticle stage driving system 57 drive the reticle stage 30 in accordance with the measured value and control information from the main control system 24A. Further, the sample stage 20 according to the present embodiment (wafer 19) can move at a constant speed in the X-direction by the wafer stage driving system 23 and the X-Y stage 21, and can move stepwisely in the X-direction and the Y-direction. At the time of scanning and exposing operation, after the shot region 6f exposure target on the wafer 19 is moved to a scan-starting position by stepwise movement of the sample stage 20, with the sample stage 20 and the reticle stage 30 being driven synchronously, the reticle 1 and the wafer 19 are relatively scanned at a velocity ratio corresponding to a projection magnification in the X-direction with respect to the projection optical system PL1, thereby transferring the pattern image of the reticle 1 on the shot region sequentially.

In the present embodiment also, since an aberration is generated in the image-forming luminous flux by the dust-proof transparent substrate 3 provided to the reticle 1, the projection optical system PL1 is designed and produced to compensate the aberration generated by the substrate 3 based on the premise that the substrate 3 is used. With these design and production, even if the substrate 3 is used, the pattern image of the reticle 1 can be transferred on the wafer 19 with high precision.

In the present embodiment also, information on the thicknesses of the substrates provided to the reticles to be exposed is stored in an exposure data file in the storage device 25 in order to cope with the variation in the thicknesses of the transparent substrates 3. Further, in the lens barrel 33 of the projection optical system PL1, the concave mirror 34 is accommodated in a lens frame 35, the lenses 37 and 38 in the vicinity of the aperture stop 15 are accommodated in the lens frame 39, and the lens frames 35 and 29 can finely move independently from each other in the Z-direction by a vertically driving unit 36. The lens frames 35, 39 and the vertically driving unit 36 constitute an image-forming state adjusting mechanism. The main control system 24A drives at least one of the lens frames 35 and 39 in the Z-direction so as to compensate an aberration generated by the substrate 3 through the vertically driving unit 36 in accordance with the thickness of the transparent substrate 3. With this operation, even if the thicknesses of the substrates 3 are varied, the pattern image of the reticle 1 can be transferred with high precision.

Next, another embodiment of the projection optical system (catadioptric system) of the projection exposure apparatus using the reticle 1 of FIG. 1 will be explained with reference to FIG. 5.

Figure 5:
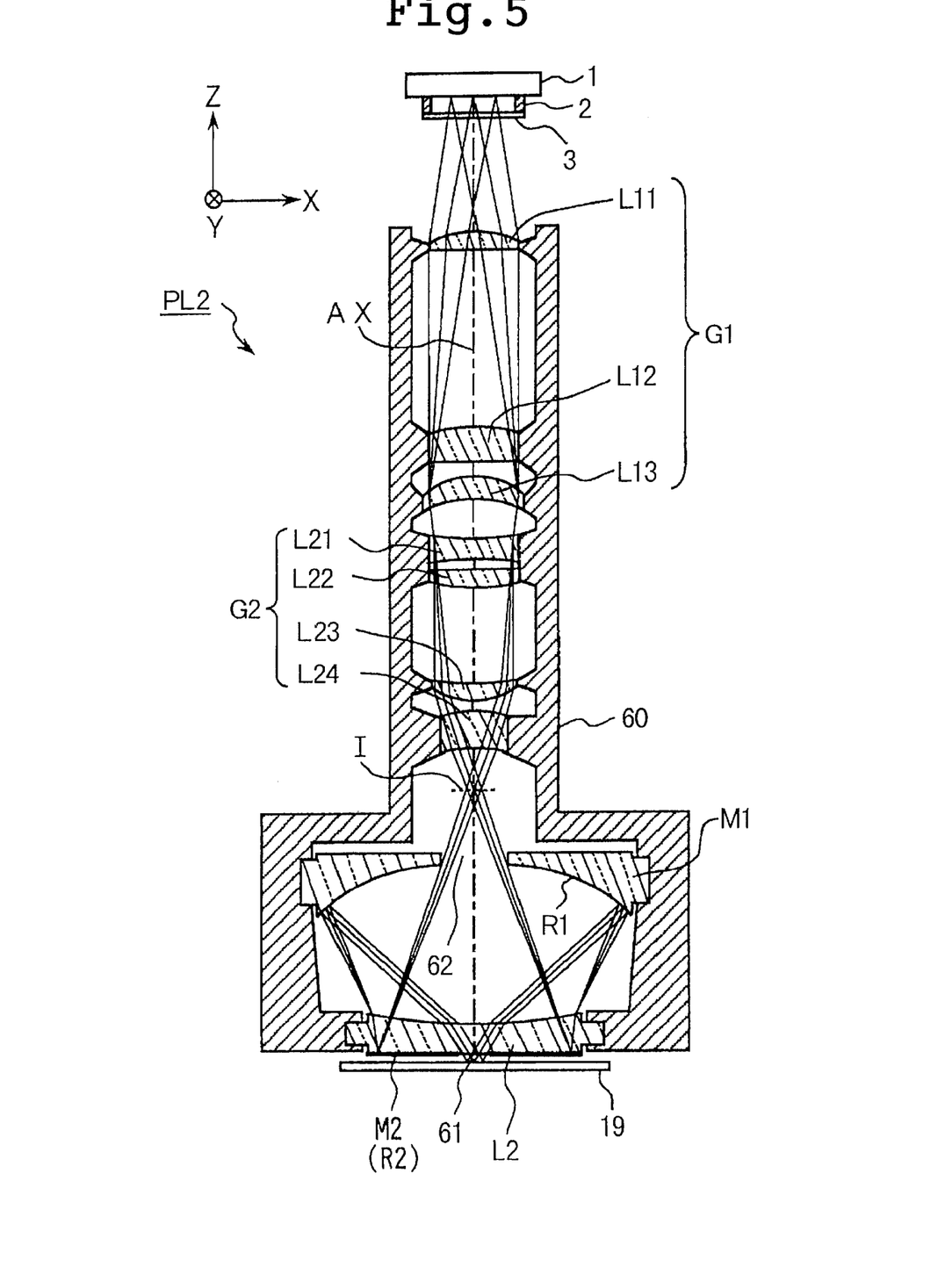
FIG. 5 is a sectional end view of another example of a projection optical system of the projection exposure apparatus for performing exposure using the reticle 1 shown in FIG. 1.

FIG. 5 is a sectional end view showing an inner structure of a projection optical system PL2 of the present embodiment. In FIG. 5, the projection optical system PL2 of the present embodiment of the catadioptric system includes a first image-forming optical system for forming a primary image (medium image) I of the pattern of the reticle 1, and a second image-forming optical system for forming a secondary image of a reticle pattern with reduced magnification based on the light from the primary image I on the wafer 19 as a photosensitive substrate.

The first image-forming optical system includes a first lens group G1 having a positive reflecting power, an aperture stop (not shown) and a second lens group G2 having a positive reflecting power, arranged in this order from the reticle side. The first lens group G1 includes a positive meniscus lens L11 having an aspherical convex surface directed toward the reticle, a positive meniscus lens L12 having an aspherical convex surface directed toward the reticle, and a positive meniscus lens L13 having an aspherical concave surface directed toward the wafer, arranged in this order from the reticle side. The second lens group G2 includes a biconcave lens L21 one of the surfaces of which closer to the reticle is formed into aspherical shape, a biconvex lens L22 one of the surfaces of which closer to the reticle is formed into aspherical shape, a positive meniscus lens L23 having an aspherical convex surface directed toward the wafer, and a positive meniscus lens L24 having an aspherical concave surface directed toward the wafer, arranged in this order from the reticle side.

The second image-forming optical system includes a main mirror M1 having a reflecting surface R1 the concave surface of which is directed toward the wafer and having a circular opening 62 provided at the center of the main mirror M1 with the center of the opening 62 being located on the light axis AX, a lens component L2, and a sub-mirror M2 having a reflecting surface R2 provided on a lens surface of the lens component L2 closer to the wafer, arranged in this order from the reticle side. The sub-mirror M2 is formed at its central portion with a circular opening 61 the center of which is located on the light axis AX. The opening 62 of the main mirror M1 and the opening 61 of the sub-mirror M2 constitute a transmittance portion through which exposure light passes. From another aspect, the sub-mirror M2 and the lens component L2 constitute a back surface reflecting mirror, and the lens component L2 constitutes a reflective portion of the back surface reflecting mirror. In this case, when an image-forming magnification of the first image-forming optical system is represented by β1, and an image-forming magnification of the second image-forming optical system is represented by β2, as one example, it is preferable that a relation of $0.7<|\beta1/\beta2|<3.5$ is satisfied.

All the optical elements (G1, G2, M1, L2, M2) constituting the projection optical system PL2 are disposed along the single light axis AX. The main mirror M1 is disposed in the vicinity of a position where the primary image I is to be formed, and the sub-mirror M2 is disposed in the vicinity of the wafer W.

In the present embodiment, an image-forming luminous flux of exposure light from the pattern of the reticle 1 forms the primary image (medium image) I of the reticle pattern through the transparent substrate 3 and the first image-forming optical system, and the image-forming luminous flux from the primary image I is reflected by the sub-mirror M2 through the central opening 62 of the main mirror M1 and the lens component L2. The light reflected by the sub-mirror M2 passes through the lens component L2 and is reflected by the surface reflecting face R1 of the main mirror M1, and then the light forms the secondary image of the reticle pattern with reduced magnification on the surface of the wafer W through the lens component L2 and the central opening 61 of the sub-mirror M2. In the case of the embodiment shown in FIG. 5, an image-forming magnification β1 of the first image-forming optical system is 0.6249, an image-forming magnification β2 of the second image-forming optical system is 0.4000, and an projection magnification β from the reticle 3 with respect to the wafer W is 0.25 (one fourth). One example of detailed lens data of the projection optical system PL2 shown in FIG. 5 is disclosed in Japanese Patent Application No. 10-370143, herein incorporated by reference, filed by the assignee of the present application.

In the present embodiment, fluorite, i.e., $CaF_2$ crystal is used for all the reflective optical members (lens components) constituting the projection optical system PL2, and fluorine laser light ($F_2$ laser light) is used as the exposure light. An oscillating center wavelength of the $F_2$ laser light is 157.6 nm. In the projection optical system PL2 of the present embodiment, a chromatic aberration is corrected with respect to light the wavelength width of which is 157.6 nm±10 pm, and various aberrations such as spherical aberration, astigmatic aberration and distortion aberration are also excellently corrected based on the premise that the substrate 3 of the reticle 1 is used. Further, in order to restrain a surface variation of the reflecting face of the main mirror M1 due to a temperature variation to maintain the excellent image-forming ability, a supporting member supporting the surface reflecting face R1 of the main mirror M1 is formed of material having linear expansion coefficient of 3 ppm/°C. or smaller, such as titanium silicate glass. As the titanium silicate glass, ULE (Ultra Low Expansion: trade name) by Corning Inc. may be used.

In the projection optical system PL2 of the present embodiment, since all the optical elements constituting the catadioptrics are disposed along the single light axis, it is possible not only to reduce the chromatic aberration and the like by using the reflecting member, but also to design and produce the lens barrel by a technique that resides in an extension of the conventional straight barrel type reflective system, and the precision can be enhanced without manufacturing difficulty. That is, in the present embodiment, the lenses L11 to L24 constituting the first image-forming optical system, the main mirror M1 constituting the second image-forming optical system, and the lens component L2 integrally formed with the sub-mirror M2 are substantially sealed in the lens barrel 60.

Further, in the present embodiment, if light having a shorter wavelength of about 120 to 180 nm of vacuum ultraviolet region having a wavelength of about 200 nm or less is used, materials of the lenses L11 to L24 and the lens component L2 in the projection optical system PL2 are limited to fluoride crystalline material ($CaF_2$, $MgF_2$, LiF, $LaF_3$ and lithium-calcium-aluminum-floride (LiCAF crystal) and the like) having a high transmissivity with respect to the light of this wavelength region, and a synthetic quartz glass doped with fluorine and the like. Further, since the luminous flux of this wavelength region is strongly absorbed by oxygen, water vapor, hydrocarbon-based gas and the like which exists in an ordinary atmosphere, as described above, it is necessary to suppress a concentration of these gases in the optical path through which the exposure light passes down to about 10 ppm or less. Therefore, in a space (space from the lens L11 to the lens component L2 in FIG. 5) which forms the image-forming optical path in the lens barrel 60 which holds each of the optical members (lenses L11 to L24, the main mirror M1 and the lens component L2), it is desirable to preclude the above-mentioned gas strongly absorbing the light flux, and to replace the gas by other gas such as helium, neon, argon and nitrogen gas that does not absorb the light flux so much.

In each of the above embodiments, the projection exposure apparatus PL may be designed and produced to correct its aberration with consideration given to even an image-forming error due to deflection caused when the reticle 1 is placed on the reticle stage RST in addition to the thickness of the substrate 3 (if necessary, flatness also). Alternatively, the image-forming error caused by the deflection may be compensated by moving the lens, like the producing error (the above-described difference between reference value and the actual thickness) concerning the thickness of the substrate 3.

Each of projection exposure apparatuses of the above embodiments may employ a structure in which an adjusting range of the image-forming state adjusting mechanism is widened, and each of the aberrations of the projection optical systems can be adjusted optimally with respect to both the reticle 1 having the transparent substrate 3 and a reticle that does not use the transparent substrate 3. To realize this structure, a moving range of the optical members by the image-forming state adjusting mechanism is increased or a plurality of image-forming state adjusting mechanisms are provided in the projection optical system, and a plurality of optical members are designed such that they can move.

In each of the above embodiments, the information concerning the thickness of the substrate 3 and the like is stored in the storage device 25. Alternatively, this information may be stored in a host computer which collectively control a large number of apparatuses in a clean room where the projection exposure apparatus is disposed, and the projection exposure apparatus (main control system 24 or 24A) may obtain the information through network or the like when necessary.

Figure 4:
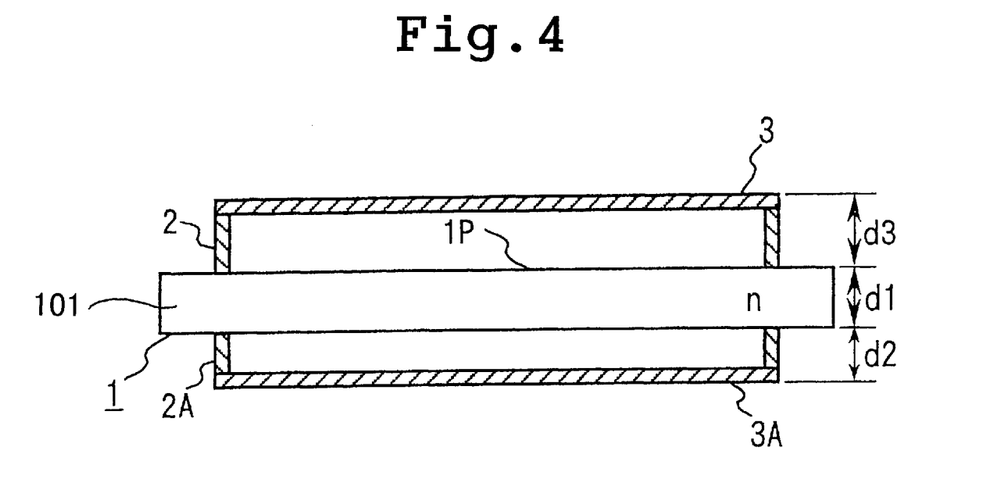
FIG. 4 is a partially sectional side view of a reticle provided at its opposite surfaces with dustproof transparent substrates.

Further, especially when the substrate 101 of the reticle 1 is thin as shown in FIG. 4, a dustproof transparent substrate 3A may be provided via a holding frame 2A over a surface of the reticle 1 on the opposite side from the pattern surface 1P. In this case, it is desirable to set a distance between the reticle 1 and the transparent substrate 3A provided over the surface of the reticle 1 at the opposite side from the pattern surface 1P such that an optical path length $\delta 1$ (=n×d1+d2) between the pattern surface 1P and the transparent substrate 3A provided over the surface of the reticle 1 at the opposite side from the pattern surface 1P becomes substantially equal to an optical path length $\delta 2$ (=d3) between the pattern surface 1P and the transparent substrate 3 provided over the surface of the reticle 1 at the side of the pattern surface 1P. With this setting, it is possible for an image of foreign particles attached on the transparent substrate 3A to be made a defocused state and not to be projected on the substrate to be exposed without increasing the distance between the transparent substrate 3A and the reticle 1 more than necessary. The above-mentioned "n" represents a reflective index of the substrate 101 of the reticle 1, "d1" represents a thickness of the substrate 101 of the reticle 1, "d2" represents a distance between the reticle 1 and a surface of the transparent substrate 3A provided over the surface of the reticle 1 opposite from the pattern surface 1P, and "d3" represents a distance between the reticle 1 and a surface of the transparent substrate 3 provided over the pattern surface 1P of the reticle 1.

The reticle is not limited to a reticle made of only a lightproof layer such as chromium (Cr), and the reticle may be a phase-shift reticle such as a space frequency modulation type (Shibuya and Rebenson type) reticle, an edge-emphasizing type reticle and a halftone type reticle.

A use for the projection exposure apparatus using the reticle 1 having the dustproof transparent substrate 3 is not limited to a projection exposure apparatus for producing semiconductor devices, and this projection exposure apparatus can be widely applied, e.g., to a projection exposure apparatus for liquid crystal display device for exposing a liquid crystal display device pattern on a square glass plate, and a projection exposure apparatus for producing a thin-film magnetic head. Further, the present projection exposure apparatus can also be used for producing a reticle (mask) by photo lithography method using far ultraviolet light (DUV light) or vacuum ultraviolet light (VUV light) as the exposure light. A magnification of the projection optical system is not limited to the reduced magnification only, but may be equal magnification or increased magnification.

A single wavelength laser of infrared wavelength region or visible wavelength region oscillated from a DFB semiconductor laser or a fiber laser, instead of the excimer laser, the $F_2$ laser and the like, may be amplified by a fiber amplifier doped with erbium (Er) (or both erbium and ytterbium (Yb)), and a harmonics of converted ultraviolet light using nonlinear optical crystal may be used.

Further, the exposure illumination light is not limited to far ultraviolet light (DUV light), vacuum ultraviolet light (VUV light) and the like, and the exposure illumination light may be extreme ultraviolet light (EUV light/XUV light) in a soft X region having a wavelength of 5 to 15 nm, e.g., 13.4 nm or 11.5 nm. A reflecting type mask is used for an EUV exposure apparatus.

The projection exposure apparatus of the embodiments can be produced in such a manner that an illumination optical system and a projection optical system including a plurality of lenses are incorporated in a projection exposure apparatus body, the projection exposure apparatus body including a reticle provided with a dustproof transparent substrate is optically adjusted, a reticle stage and a wafer stage including a large number of mechanical parts are mounted in the projection exposure apparatus body, wires and tubes are connected, and the projection exposure apparatus body is adjusted totally (electrical adjustment, validation and the like). It is preferable to produce the projection exposure apparatus in a clean room in which a temperature and a clean degree therein are controlled.

A semiconductor device is produced through a step for designing function and performance of the device, a step for producing a reticle based on the former step, a step for producing a wafer from silicon material, a step for exposing a pattern of the reticle onto the wafer by the projection exposure apparatus of the above-described embodiments, a step for assembling the device (including a dicing step, a bonding step and a packaging step), a step for inspection, and the like.

According to the photomask of the present invention, the transparent substrate is disposed over a pattern surface at a predetermined distance. Therefore, even when an exposure beam of shorter wavelength is used in an ultraviolet region, there are merits that it is possible to prevent foreign particles from attaching the pattern surface, and to obtain sufficient endurance against the exposure beam.

Further, according to the projection exposure apparatus of the present invention, there are merits that when the photomask of the present invention is used, an aberration of an image-forming luminous flux generated by a relatively thick dustproof substrate is compensated, and the image of the pattern of the photomask can be transferred with high precision.

In this case, by providing the image-forming state adjusting mechanism, even when the thickness of the dustproof substrate is slightly varied, it is possible to transfer an image precisely without being influenced by the thickness variation.

The entire disclosure of Japanese Patent Application No. 10-72074 filed on Mar. 20, 1998 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. An exposure method for transferring a pattern of a mask onto a predetermined surface with an exposure beam, said method comprising:

illuminating said mask with said exposure beam, said mask including a pattern surface and a substrate, the pattern being formed on the pattern surface, and a space between the substrate and the pattern surface that is substantially sealed, the substrate is disposed such that the substrate is separated at a predetermined distance from said pattern surface, transferring said pattern onto said predetermined surface through the substrate and the space;

wherein said substrate is transparent with respect to the exposure beam, and wherein said substrate is made of synthetic quartz doped with fluorine to reinforce endurance against the exposure beams.

2. An exposure method as recited in claim 1, wherein the exposure beam is of ultraviolet light having a wavelength of about 100 nm to about 300 nm, and the sealed space is filled with a gas selected from the group consisting of a nitrogen gas, a helium gas and a hydrogen gas.

3. An exposure method as recited in claim 1, wherein the distance between said substrate and said pattern surface is about 2 mm to about 10 mm, and a thickness of said substrate is about 0.05 mm to about 2 mm.

4. A method for manufacturing a device, comprising:

the exposure step of transferring, using the exposure method as recited in claim 1, an image of the pattern of the mask onto the substrate to be exposed.

5. An exposure method for transferring an image of a pattern of a mask onto a photosensitive substrate with an exposure beam, said method comprising:

disposing said mask including a substrate such that said substrate is separated, at a predetermined distance via a supporting member, from a pattern surface on which the pattern is formed, and adjusting an image-forming state of the image of the pattern in consideration of at least one of the predetermined thickness of said substrate and the distance between said substrate and the pattern surface;

wherein said substrate is transparent with respect to the exposure beam and wherein said substrate has a predetermined thickness.

6. An exposure method as recited in claim 5, comprising reading information of at least one of the predetermined thickness and the distance between said substrate and the pattern surface from a storage device, and adjusting the image-forming state of the image of the pattern by driving at least one optical element included in a projection optical system, and transferring the image of the pattern onto the photosensitive substrate according to the read information.

7. An exposure method as recited in claim 5, wherein said transferring is effected by a projection optical system, and
wherein said adjusting is effected when said projection optical system is produced.

8. An exposure method as recited in claim 5, wherein the mask is supported on a mask stage, and
said image-forming state is adjusted with consideration also given to a deflection amount of said substrate generated when said mask is supported by said mask stage.

9. A method for manufacturing a device, comprising:

the exposure step of transferring, using the exposure method as recited in claim 5, the image of the pattern of the mask onto the photosensitive substrate.

10. An exposure method as recited in claim 5, further comprising correcting aberrations originating in the thickness of the substrate.

11. An exposure method as recited in claim 5, further comprising correcting aberrations originating in the distance between the substrate and the pattern surface.

* * * * *